United States Patent [19]

Shimura

[11] Patent Number: 5,192,700
[45] Date of Patent: Mar. 9, 1993

[54] METHOD OF MAKING FIELD EFFECT TRANSISTOR

[75] Inventor: Teruyuki Shimura, Itami, Japan

[73] Assignee: Mitsubishi Denki Kabushiki Kaisha, Tokyo, Japan

[21] Appl. No.: 828,374

[22] Filed: Jan. 30, 1992

Related U.S. Application Data

[62] Division of Ser. No. 289,390, Dec. 22, 1988, Pat. No. 5,101,245.

[30] Foreign Application Priority Data

Dec. 28, 1987 [JP] Japan .................. 62-335887

[51] Int. Cl.$^5$ .................... H01L 21/70
[52] U.S. Cl. .................. 437/41; 437/40; 437/22
[58] Field of Search ............ 437/26, 29, 39, 40, 437/41, 126, 176, 22; 148/DIG. 84

[56] References Cited

U.S. PATENT DOCUMENTS

| | | | |
|---|---|---|---|
| 4,434,013 | 2/1984 | Bol | 437/34 |
| 4,590,502 | 5/1986 | Morkoc | 357/22 |
| 4,662,058 | 5/1987 | Cinillo, Jr. et al. | 437/39 |
| 4,839,703 | 6/1989 | Ohata et al. | 357/22 |

OTHER PUBLICATIONS

"A High-Current Drivability i-AlGaAs/n-GaAs Doped-Channel MIS-Like FET (DMT)," by Hida et al., IEEE Electron Device Letters, vol. EDL-7, No. 11, Nov. 1986.

Primary Examiner—Tom Thomas
Attorney, Agent, or Firm—Leydig, Voit & Mayer

[57] ABSTRACT

A field effect transistor including a semi-insulating semiconductor substrate, a first conductivity type semiconductor layer disposed on the substrate and forming a heterojunction with the substrate, second conductivity type spaced apart source and drain regions extending through the layer into the substrate, a metallic gate disposed on the layer between the source and drain regions, and a second conductivity type channel disposed in the substrate extending between the source and drain regions and forming a pn heterojunction with the layer for reducing leakage current from the channel to the gate. The second conductivity type channel is produced by ion implantation, and the implantation conditions are controlled as a mechanism for controllably establishing a threshold voltage for the field effect transistor.

9 Claims, 2 Drawing Sheets

METHOD OF MAKING FIELD EFFECT TRANSISTOR

This is a divisional of copending application Ser. No. 289,390, filed on Dec. 22, 1988, now U.S. Pat. No. 5,101,245.

FIELD OF THE INVENTION

The present invention relates to field effect transistors and a method of making them. More particularly, the invention relates to high performance field effect transistors for high, frequency high power applications, capable of handling large amplitude input signals.

BACKGROUND OF THE INVENTION

For a variety of reasons, an important application of III-V semiconductor devices is in field effect transistors. A common configuration is the MESFET which has a metallic electrode formed on a doped active layer which serves as a channel for the semiconductor device. Turn-on voltage limitations in that type of device tends to limit the maximum amplitude of signals which can be applied.

A number of devices have been proposed to accommodate larger amplitude signals. Among them is the MIS-like FET which interposes an insulator layer between the metallic gate and the doped active layer. The device is called MIS-like because the insulators which have been used are not true insulators, but are doped or undoped semiconductor material.

FIG. 3 illustrates, in cross-section, a typical construction for a MIS-like FET. The FET of FIG. 3 is constructed of III-V compound semiconductors including a semi-insulating GaAs substrate 1 on which an n-type GaAs layer 2 is epitaxially grown. The conventional FET of FIG. 3 generally employs a portion of layer 2 as the active layer of the FET, that is, as the channel through which the charge carriers of interest flow. An undoped layer 3, preferably of AlGaAs, is disposed on layer 2. The AlGaAs layer is epitaxially grown by a conventional technique. A gate 4 disposed on layer 3 is a conventional refractory metal gate electrode, such as WSi. Gate 4 is disposed between spaced apart n+-type source and drain regions 5a and 5b. The source and drain regions extend from the exposed surface of layer 3 through layers 3 and 2 and into substrate 1. The source and drain regions are usually produced by ion implantation. Electrical contacts are made to the source and drain regions through source and drain electrodes 6 and 7, respectively, which may be conventional contacts, such as an alloy containing gold and germanium. Electrodes 6 and 7 may be deposited in the desired locations by employing a vapor deposition step with a conventional lift-off step.

Source and drain regions 5a and 5b are spaced apart on opposite sides of gate 4 with which they are aligned. This alignment is conventionally achieved by first depositing gate 4 and employing it as a mask during the ion implantation step that produces the source and drain regions. Gate 4 may be deposited by sputtering a WSi layer onto the exposed surface of layer 3 and removing the unwanted portions of the metallic layer by etching, such as reactive ion etching. Isolation regions 8 are disposed in layers 2 and 3 on opposite sides of the device for electrical isolation of the source and drain regions from other active regions in layers 2 and 3. Isolation regions 8 may be produced by a number of conventional techniques, including ion implantation.

In the FET of FIG. 3, the majority charge carriers, here electrons, flow through a channel in layer 2 that is disposed between the source and drain. The current flow through the channel may be constricted by the application of a sufficiently negative voltage to gate 4. That voltage produces an electric field that penetrates layer 3 to influence current in layer 2. Because of the presence of insulating layer 3, relatively large amplitude signals can be applied to gate 4 to obtain a relatively large signal response from the FET. Since source and drain regions 5a and 5b are preferably self-aligned through the use of gate 4 as a mask during ion implantation, the separation between gate 4 and source (drain) region 5a (5b) can be relatively small. The small spacing means that the source (drain) series resistance is relatively low so that a high gain FET is produced.

As is well understood in the art, in an FET of the type shown in FIG. 3, the channel between the source and drain regions behaves as a resistor when relatively low voltages are applied between the source and drain. For a particular gate-to-source voltage, once the drain-to-source voltage exceeds a threshold, the drain-to-source current remains relatively constant as the drain-to-source voltage changes. This threshold gate-to-source voltage is also referred to as the knee of the current-voltage characteristic of the FET. The desired FET operating points lie above the threshold gate-to-source voltage. The threshold voltage generally corresponds to the minimum voltage required to deplete the channel of electrons.

For the structure shown in FIG. 3, that threshold voltage is given by $$V_{th} = \phi_B - \Delta E_C - qN_d t_n(2t_o + t_n)/2\epsilon.$$

In the threshold voltage equation, $\phi_B$ is the Schottky barrier potential between metallic gate 4 and layer 3. Generally, that potential is about 0.6 to 0.8 volts. Since layers 2 and 3 form a heterojunction and the carriers of interest are electrons, the second term of the equation, $\Delta E_C$, is the discontinuity in the conduction bands of the materials in layers 2 and 3, when the FET is in thermal equilibrium. In the final term of the equation, q is the electronic charge, $N_d$ is the density of majority carriers (here, electrons) in layer 2, $\epsilon$ is the absolute dielectric constant of the semiconductor material, $t_n$ is the thickness of layer 2, and $t_o$ is the thickness of layer 3. In formulating the equation, it has been assumed that layer 3 is substantially intrinsic and that the densities of electrons and of holes in layer 3 are essentially the same. As a result, that layer acts much like an electrical insulator and does not significantly attenuate the electric field that originates at gate 4.

It follows from the equation that, for a given conductivity, i.e., majority carrier density level, in layer 2, there is very little selectivity in choosing the threshold voltage. In that case, only the thicknesses of layers 2 and 3 can affect the threshold voltage. Adjustment of the thickness of layer 2 can significantly alter the gain of the device as well as change the resistance of the channel extending between the drain and source regions. While that can be altered from wafer to wafer, there is no ready mechanism for producing FETs on the same wafer with different threshold voltages. That limitation presents a significant disadvantage in producing ICs.

A further disadvantage of the structure of FIG. 3 lies in the inability to equalize the densities to majority and minority carriers in AlGaAs, which is the preferred material for layer 3. The inability to equalize those carrier densities precisely means that layer 3 is not a strong insulator, i.e., that the maximum resistance of layer 3 is limited. As a result, nominally intrinsic layer 3 is actually n-type, so that a leakage current flows between gate 4 and one or both of the source and drain regions. That leakage current interferes with device performance.

In order to isolate the device of FIG. 3 from other devices in the same substrate, it is necessary that isolation regions 8 extend through both layers 2 and 3 and into semi-insulating substrate 1. Isolation regions 8 may be formed by chemical etching, with or without the filling of the grooves so formed, or may be prepared by ion implantation with p-type impurities, such as magnesium, or impurities forming deep levels, such as boron. The depth of etching and ion implantation required to form isolation regions 8, i.e., penetrating layer 2 and 3, causes problems and increases costs in manufacturing IC's with the FET of FIG. 3.

SUMMARY OF THE INVENTION

It is a general aim of the invention to provide a field effect transistor having a selectable threshold voltage, reduced gate leakage current, and simplicity of construction.

In that regard, it is an object of the present invention to provide a process for producing a junction FET (J-FET) in which different FETs on the same wafer can have different controllably established threshold voltages.

It is another object of the present invention to produce a J-FET having a gate structure which minimizes gate leakage current through the layer separating the gate electrode from the channel.

Another object of the invention is the reduction of the depth of the isolation regions in order to simplify the construction and fabrication process of the FET.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

In accordance with the present invention, a field effect transistor has a semi-insulating semiconductor substrate on which a layer of a another, wider band gap material of a first conductivity type is disposed. Spaced apart drain and source regions of a second conductivity type opposite the first conductivity type extend through the layer into the substrate. A metallic gate is disposed on the layer between the source and drain regions, and a second conductivity type channel is disposed in the substrate extending between the source and drain regions opposite the gate. A pn heterojunction thereby formed between the channel and layer blocks leakage current flowing from the channel to the gate.

It is a feature of the invention that by altering the doping level of the layer, the threshold voltage of the FET can be varied even though the characteristics of substrates of different FETs are the same.

The novel field effect transistor is fabricated by epitaxially growing a layer of a semiconductor of a first conductivity type on a semi-insulating substrate, forming a channel of a second conductivity type opposite the first conductivity type in the substrate by ion implantation to form a pn heterojunction with the layer, forming a metallic gate on the layer opposite the channel, and self-alignlingly forming on opposite sides of the gate, preferably by ion implantation, spaced apart source and drain regions of the second conductivity type in the layer, extending into the substrate and contacting the channel. The channel is formed without altering the conductivity type of the layer so that a pn heterojunction reducing current leakage from the channel to the gate is achieved.

DETAILED DESCRIPTION OF PREFERRED EMBODIMENTS

Turning now to the drawings, FIGS. 1(a)–1(d) illustrate the steps for producing an FET according to an embodiment of the present invention. A semi-insulating substrate 21, preferably of GaAs, has an exposed surface oriented toward the top of FIG. 1(a). A doped epitaxial layer 22a is grown on the exposed upper surface of substrate 21. The epitxilly grown layer 22a is preferably of a different semiconductor material from that of substrate 21 and preferably has a larger band gap. Layer 22a may be p-type AlGaAs containing sufficient aluminum to increase the band gap over that of GaAs. Layer 22a preferably has a thickness of 100 to 1000 Angstroms and is most preferably about 200 Angstroms in thickness. The density of majority carriers in layer 22a is preferably in the range from about $5 \times 10^{17}$ to $5 \times 10^{18}/cm^3$.

Figure 1:
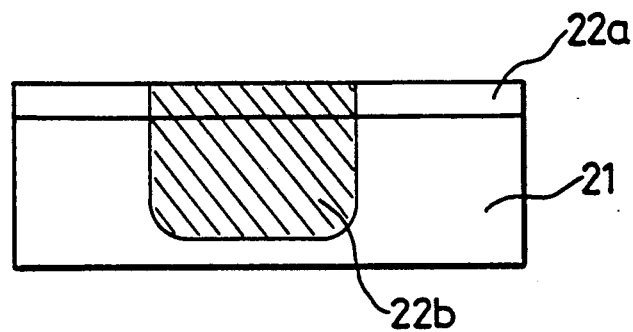
FIGS. 1(a)–1(d) are schematic cross-sectional views of the steps in a process for producing an FET according to the invention.
Figure 1:
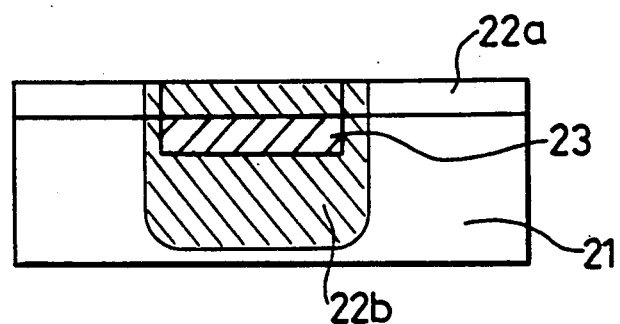
Figure 1:
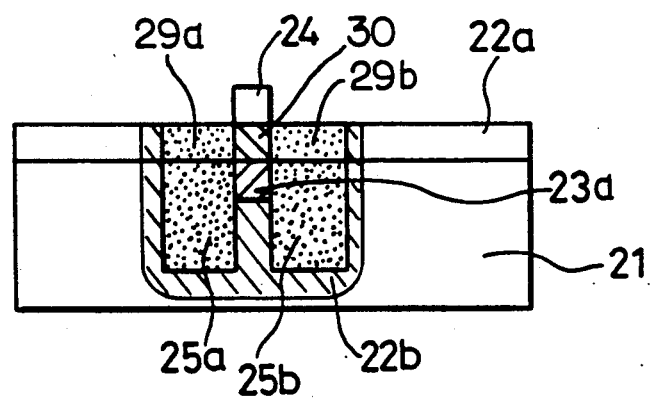
Figure 1:
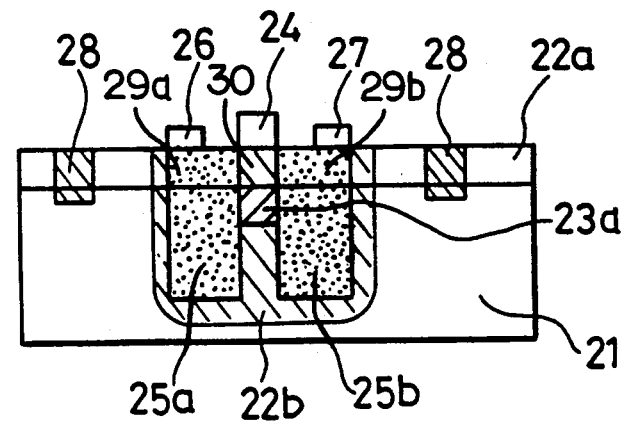

In the embodiment of FIG. 1, a region 22b of the same conductivity type as layer 22a is formed in a portion of layer 22a and extends well into substrate 21. When region 22b is p-type, it can be formed by implanting beryllium in the GaAs substrate. The beryllium ions can be accelerated to energies of 50 to 300 KeV and a preferred concentration is in the range of $10^{11}$ to $5 \times 10^{12} cm^2$.

As illustrated in FIG. 1(b), a selective channel implant step is carried out to form a channel region 23 within region 22b that lies partly within layer 22a and within substrate 21. Advantageously the same mask used to implant the region 22b is used for implantation of the region 23. Region 23 has a conductivity type opposite from that of layer 22a. Where layer 22a is p-type, channel region 23 is of n-type, and may be formed by implanting silicon ions accelerated to an energy ranging from 50 KeV to 200 KeV in a density of $10^{12}$ to $5 \times 10^{13} cm^2$. Since the concentration of n-type dopants in region 23 exceeds the density of p-type dopants in the region of 22b that lies within substrate 21, an inverted conductivity type channel region is formed within substrate 21 adjacent to layer 22a. However, in layer 22a, the density of p-type dopants is several orders of magnitude larger than the density of n-type dopant elements implanted to form channel region 3. As a result, no portion of layer 22a is inverted in conductivity type. All of layer 22a retains its original conductivity type, p-type in the example described.

After the steps illustrated in FIGS. 1(a) and 1(b) are completed, a metallic gate 24 is disposed on the surface of layer 22a that is uppermost in FIG. 1(c). Preferably, gate 24 is a refractory metal compound, such as the conventional WSi gate. The desired location of the gate may be defined using a combination of sputtering and reactive ion etching steps. In the sputtering step, a film of the metallic material is deposited on the surface of layer 22a. Undesired portions of the film are removed by reactive ion etching.

After gate 24 is defined, it is employed as an ion implantation mask to form self-aligned source and drain regions 25a and 25b, respectively. Thus, gate 24 masks and protects a channel 23a within channel region 23 from ion implantation during the formation of the source and drain regions. In the specific example being discussed, n-type dopant ions are employed to form source and drain regions 25a and 25b, which are connected by the channel 23a. For example, silicon ions accelerated to energies of 50 KeV to 300 KeV and in dosages from $10^{13}$ to $10^{14}$cm$^2$ are implanted to form the source and drain regions.

In practicing the invention, the source and drain ion implantation create a number of distinct regions in the active layer 22a, including regions 29a, 29b in the source and drain region and a central protected region 30 over the channel 23a. The density of n-type dopants that come to rest and are active in the regions 29a, 29b is sufficiently high to convert portions of that layer to n-type conductivity. Those portions provide external access to the source and drain regions. The source and drain regions extend at least deeply enough into substrate 21 to contact channel region 23. That contact completes the active portion of the device. Charge carriers can flow between the source and drain regions through a channel lying in substrate 21, opposite gate 24, without crossing a potential barrier, i.e., entering a material of a different conductivity type.

The central region 30 of layer 22a, however, is not inverted as are the regions 29a, 29b. Since layer 22a has a different conductivity type and is of a different material from those of channel region 23, a pn heterojunction is formed between the regions 30 and 23a opposite gate 24. In addition, pn homojunctions are formed between the n-type regions 29a, 29b of the layer 22a and the non-inverted p-type central region 30. Current flow from the channel to the gate is discouraged by the potential barrier of these pn junctions that lie along all of the available current paths including the path in the layer 22a between the regions 30 and 29a, 29b, and the path between the channel 23a and the region 30. Thereby, leakage current is significantly reduced over that experienced with the structure of FIG. 3. Because of the self-aligning ion implantation step used to produce the source and drain regions, their separation may be kept small, meaning that the source series resistance is desirably low. Therefore, as with the structure of FIG. 3, the novel J-FET of FIG. 1 also provides high gain and relatively large signal amplitude capacity.

The structure of FIG. 1 is completed in the steps illustrated in FIG. 1(d). Electrodes 26 and 27 are formed on source and drain regions 25a and 25b, respectively, for making external contacts. Electrodes 26 and 27 may be of a conventional alloy, such as one containing gold and germanium, that makes a useful ohmic contact to GaAs. The electrodes may be disposed at the desired locations using the liftoff technique in which a photoresist is applied to all but the desired locations of the electrodes. After deposition of a film of the electrode material, the remaining photoresist and overlying film is removed.

Finally, isolation regions 28 are each disposed on opposite sides of the field effect transistor. Isolation regions 28 electrically isolate the transistor from other electronically active elements that employ parts of layer 22a. The isolation regions extend through layer 22a and into semi-insulating substrate 21. The isolation regions 28 may be formed by ion implantation of dopants that produce an opposite conductivity type from that of layer 22a. For example, silicon ions accelerated to energies of 50 KeV to 100 KeV and in dosages from $10^{12}$ to $10^{14}$cm$^2$, or boron ions accelerated to energies of 30 KeV to 100 KeV and in $10^{13}$ to $10^{16}$/cm$^2$ are implanted to form the isolation regions 28. Alternatively, regions 28 may be of electrically insulating material that is deposited in grooves formed by chemical etching. While two isolation regions 28 are shown in the sectional view of FIG. 1(d), it is apparent that a single annular isolation region encircling an FET would perform the desired function. Since, in any event, the isolation regions need only penetrate a single, relatively thin epitaxial layer 22a, they are more easily prepared in the novel FET than in the structure of FIG. 3 where two such layers must be penetrated.

Figure 3:
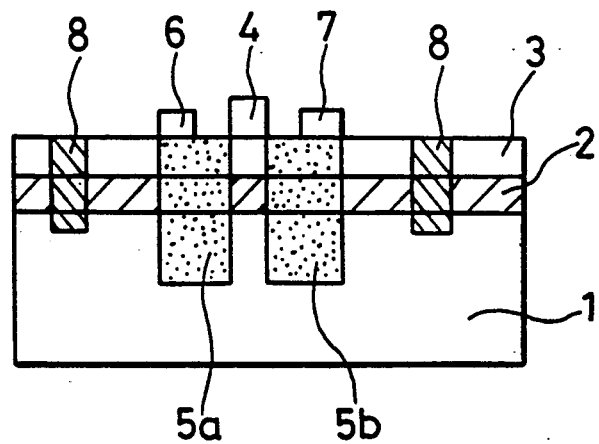
FIG. 3 is a schematic cross-sectional view of a conventional FET.

The voltage threshold of the FET structure of FIG. 1 can be analyzed in the same way described for the structure of FIG. 3. However, because the density of charge carriers in the region 30, i.e., the volume between gate 24 and channel 23a, is not negligible compared to the charge carrier density in channel 23a, the threshold voltage equation given for FIG. 3 is no longer applicable. The first two terms on the right hand side of the equation still apply, but the third term is modified by the presence of majority charge carriers in region 30. For a preselected majority charge carrier density in channel 23a, the FET threshold voltage can be significantly varied by varying the charge carrier density in layer 22a, and particularly the final charge carrier density in the central region 30. In addition, since the carrier density in channel 23 is controlled by an ion implantation dosage, rather than by the constant carrier density throughout an epitaxial layer, the threshold voltage can be controlled by controlling the ion implantation step. In the example, increasing the charge carrier density in the channel 23a by appropriate control of the ion implantation step used to form that region will serve to lower the threshold voltage.

In a particularly useful application of the invention, a plurality of FETs according to the invention can be formed on a single substrate. The threshold voltages of the FETs on the same substrate can be varied as desired by modifying the dosages of dopant atoms employed to make the channels of different FETs. At the same time, it is also possible to form diffusion resistances similar to the FETs, but having no gate, by ion implantation, and such resistances can be connected with the FETs in producing integrated circuits. The advantages of a variable threshold are useful in fabricating integrated circuits that require a plurality of FETs which have respectively different characteristics.

Figure 2:
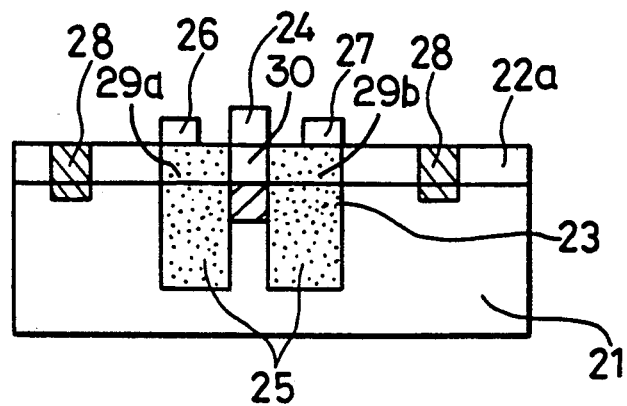
FIG. 2 is a schematic cross-sectional view of another FET structure according to the invention.

In FIG. 2, an alternative embodiment of an FET according to the invention is shown. That embodiment is identical to the embodiment of FIG. 1 with the exception of the omission in FIG. 2 of region 22b. As described in connection with FIG. 1, region 22b has a conductivity type that is opposite from that of channel region 23a and of source and drain regions 25a and 25b. Therefore, in the FIG. 1 embodiment, region 22b provides, by pn junctions, additional isolation of regions 23a, 25a, and 25b from substrate 21 and from each other. In the embodiment of FIG. 1, the current which flows between source and drain regions 25a and 25b is confined to channel 23a by region 22b. The FET embodiment of FIG. 2 is simpler and less expensive to construct than that of FIG. 1, but the omission of region 22b permits some leakage current to flow between the source and drain regions other than through channel 23a. To overcome the effects of that leakage, the minimum spacing between the source and drain regions in FIG. 2 is somewhat larger than that of FIG. 1. The increased channel length means increased channel resistance and lowered gain when the same dopant densities are used in each of the embodiments of FIGS. 1 and 2.

The embodiments described have placed emphasis upon a semi-insulating substrate of GaAs, but other semiconductor materials may be used as a substrate. Likewise, emphasis has been placed upon using AlGaAs as an epitaxial layer, but indium gallium arsenide and indium aluminum gallium arsenide are among other candidates for use as an epitaxial layer on gallium arsenide. Other elemental and compound semiconductors can also be employed in J-FETs according to the invention. The conductivity types for the specific examples described can all be reversed in embodiments of the invention. Other variations in the alloys and metallic compounds employed in the electrodes and gate metals within the scope and spirit of the invention will be apparent to those of skill in the art.

What is claimed:

1. A method of making a field effect transistor including:
   depositing on a semi-insulating substrate a semiconductor layer of a first conductivity type;
   forming a channel of a second conductivity type opposite from said first conductivity type in said substrate, thereby forming a pn junction with said layer;
   disposing a metallic gate electrode on said layer opposite said channel; and
   forming spaced apart source and drain regions of said second conductivity type in said layer, extending into said substrate, and contacting said channel, said source and drain regions lying on opposite sides of said gate electrode.

2. The method of claim 1 wherein said substrate has a first energy band gap, said layer has a second energy band gap, and said second energy band gap is larger than said first energy band gap.

3. The method of claim 1 wherein said substrate is GaAs and includes depositing said layer by epitaxially growing AlGaAs on said substrate.

4. The method of claim 1 including forming said channel and said source and drain regions by ion implantation.

5. The method of claim 4 including implanting ions to form said channel without changing the conductivity type of said layer.

6. The method of claim 4 including controlling the ion implantation conditions to establish a threshold voltage for the field effect transistor.

7. The method of claim 5 including controlling the conditions for implanting said ions to establish a threshold voltage for the field effect transistor.

8. The method of claim 1 including forming at least one isolation region extending through said layer and into said substrate for isolating said transistor electrically from portions of said layer lying beyond said isolation region.

9. The method of claim 1 including, after depositing said layer but before forming said channel, forming in said layer and said substrate a region of said first conductivity type in which said channel and said source and drain regions are subsequently formed.

* * * * *